US009008254B2

United States Patent
Lin

(10) Patent No.: US 9,008,254 B2
(45) Date of Patent: Apr. 14, 2015

(54) METHOD AND APPARATUS FOR SUPPRESSING A DETERMINISTIC CLOCK JITTER

(71) Applicant: Realtek Semiconductor Corp., Hsinchu (TW)

(72) Inventor: Chia-Liang Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 14/014,445

(22) Filed: Aug. 30, 2013

(65) Prior Publication Data

US 2015/0061787 A1 Mar. 5, 2015

(51) Int. Cl.
*H03D 3/24* (2006.01)
*H03L 7/08* (2006.01)

(52) U.S. Cl.
CPC .......................................... *H03L 7/08* (2013.01)

(58) Field of Classification Search
CPC ....... H04L 7/033; H03L 7/0891; H03L 7/093; H03L 7/087; H03L 7/18

USPC .......................................................... 375/376
See application file for complete search history.

(56) References Cited

U.S. PATENT DOCUMENTS

| 6,154,071 | A  | * | 11/2000 | Nogawa ........................ 327/156 |
| 8,253,454 | B2 |   | 8/2012 | Lin |
| 2008/0122544 | A1 | * | 5/2008 | Wang .............................. 331/17 |
| 2014/0097875 | A1 | * | 4/2014 | Tertinek et al. ................ 327/105 |

OTHER PUBLICATIONS

Elshazly et al, "Clock Multiplication Techniques Using Digital Multiplying Delay-Locked Loops," IEEE Journal of Solid State Circuits, vol. 48, No. 6, Jun. 2013, pp. 1416-1428.

\* cited by examiner

*Primary Examiner* — Juan A Torres
(74) *Attorney, Agent, or Firm* — McClure, Qualey & Rodack, LLP

(57) ABSTRACT

A method for generating an output clock comprising: detecting a timing difference between a first input clock and a second input clock to generate a phase error signal; generating a masked phase error signal by masking the phase error signal based on a deterministic jitter indicator signal; generating an oscillator control signal by filtering the masked phase error signal; and generating the output clock in accordance with the oscillator control signal.

20 Claims, 3 Drawing Sheets

METHOD AND APPARATUS FOR SUPPRESSING A DETERMINISTIC CLOCK JITTER

BACKGROUND OF THE INVENTION

1. Field of the Invention

The present invention relates to clock generation.

2. Description of Related Art

A clock is a periodic signal that can be used for providing a timing or synchronization among a plurality of circuit elements. Clocks are used in numerous applications. For instance, a clock can be used for a flip-flop circuit, which is an apparatus of data storage that updates the data it stores upon a rising edge of the clock; in this case, the rising edge of the clock defines the timing at which the flip-flop circuit updates the data. In many applications, it is highly desirable to have a clock that has perfect periodicity. For instance, it is highly desirable to have a clock where every two neighboring rising edges are separated by a fixed periodicity in time. Mathematically, the timing of a clock signal forms a sequence, say $t_n$, where n is a time index. An ideal clock would have a timing sequence that can be expressed as follows:

$$t_n = nT \qquad (1)$$

where T is the period of the clock signal. In practice, the clock usually contains a "jitter" and the timing sequence will most likely deviate from the form expressed in (1). A timing sequence of a real world clock can be expressed as follows:

$$t_n = nT + \delta_n \qquad (2)$$

where $\delta_n$ denotes a clock jitter, i.e. a timing error, at time index n. A clock jitter usually contains two components: a random jitter and a deterministic jitter. The random jitter is a random disturbance to the clock timing due to a random noise; the deterministic jitter is a disturbance to the clock timing that is pre-known or predictable. One example of deterministic jitter is a clock generated from a multiplying delay locked loop (MDLL). For instance, a MDLL comprises a (multiplexed) ring oscillator of oscillation frequency of 1 GHz, and a rising edge of a 200 MHz reference clock is periodically injected into the ring oscillator (via multiplexing), effectively breaking the oscillation and refreshing the clock edge of the ring oscillator once per five clock cycles (here, five is the frequency ratio between 1 GHz and 200 MHz) of the oscillation. Due to a timing mismatch between the multiplying path (for the injection of the rising edge of the 200 MHz clock) and the otherwise oscillation path (for the feedback of the ring oscillator to sustain the oscillation), however, the injection of the rising edge of the 200 MHz reference clock will usually introduce a deterministic jitter to the 1 GHz output of the ring oscillator; that is, there is one remarkable timing error for every five cycles of the 1 GHz clock; the clock cycle that exhibits the remarkable timing error is the clock cycle that occurs coincidentally with the injection of the rising edge of the 200 MHz reference clock. As a result, the 1 GHz clock contains a deterministic jitter that occurs coincidentally with the rising edge of the 200 MHz reference clock. While there are some methods proposed to reduce the deterministic jitter, the methods are complicated and somewhat ad hoc solutions. A solution of interest is using a PLL (phase lock loop) for receiving the 1 GHz clock with the deterministic jitter as an input clock and regenerating accordingly a 1 GHz clock with a smaller deterministic jitter as an output clock. As depicted in FIG. 1, PLL 100 comprises: a phase detector 110 for receiving the input clock and the output clock and outputting a phase error signal; a loop filter 130 for receiving the phase error signal and outputting an oscillator control signal; and a controlled oscillator for receiving the oscillator control signal and generating the output clock. PLL 100 is well known in prior art and thus not explained in detail here. It is well known that, PLL 100 enables the output clock to track a timing of the input clock while performing a low pass filtering on the timing of the input clock so that the output clock contain a much smaller deterministic jitter than that of the input clock, provided a bandwidth of PLL 100 is sufficiently smaller than a bandwidth of the deterministic jitter of the input clock. A smaller bandwidth of the PLL leads to a better suppression of the deterministic jitter of the clock that the PLL receives. However, every PLL comprises a controlled oscillator (e.g., controlled oscillator 140 of PLL 100). The controlled oscillator of the PLL also contributes a random jitter to the output clock that the PLL regenerates. A lower bandwidth (of the PLL) leads to a greater random jitter (in the output clock that the PLL generates). Therefore, there is a tradeoff between the capability of suppressing the deterministic jitter (of the input clock that the PLL receives) and the capability to refrain from introducing random jitter (to the output clock that the PLL regenerates).

Accordingly, what is desired is a method of effectively suppressing a deterministic jitter of a clock signal without introducing much random jitter.

BRIEF SUMMARY OF THIS INVENTION

In one embodiment, an apparatus comprises: a phase detector for detecting a timing difference between an input clock and an output clock and generating a phase error signal to represent the timing difference; a mask circuit for masking the phase error signal based on a deterministic jitter indicator signal to generate a masked phase error signal; a loop filter for filtering the masked phase error signal to generate an oscillator control signal; and a controlled oscillator for generating the output clock in accordance with the oscillator control signal. The input clock contains a deterministic jitter that is pre-known (in a circuit where the input clock is generated) and indicated by the deterministic jitter indicator signal. In a closed loop manner, the apparatus adjusts the output clock to track a timing of the input clock but disregard the deterministic jitter of the input clock.

In one embodiment, a method comprises: receiving an input clock and a deterministic jitter indicator signal; detecting a timing difference between the input clock and an output clock; representing the timing difference using a phase error signal; masking the phase error signal based on the deterministic jitter indicator signal to generate a masked phase error signal; filtering the masked phase error signal to generate an oscillator control signal; and generating the output clock using a controlled oscillator under a control of the oscillator control signal. The input clock contains a deterministic jitter that is pre-known (in a circuit where the input clock is generated) and indicated by the deterministic jitter indicator signal. In a closed loop manner, the output clock is adjusted to track a timing of the input clock without tracking the deterministic jitter of the input clock.

DETAILED DESCRIPTION OF THIS INVENTION

The present invention relates to clock regeneration. While the specifications described several example embodiments of the invention considered best modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Figure 1:
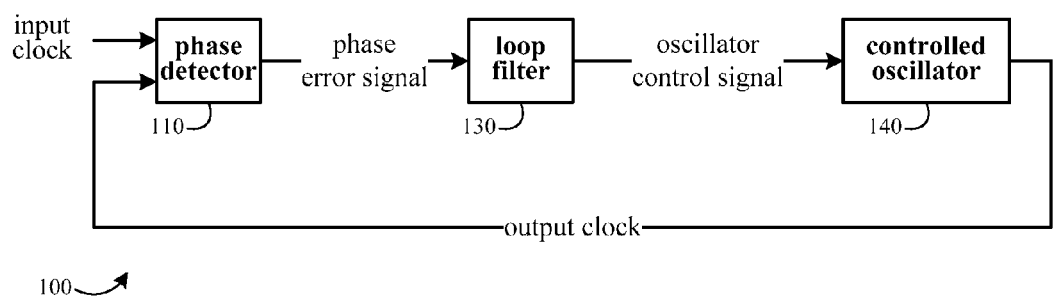
FIG. 1 shows a functional block diagram of a PLL (phase lock loop).
Figure 2:
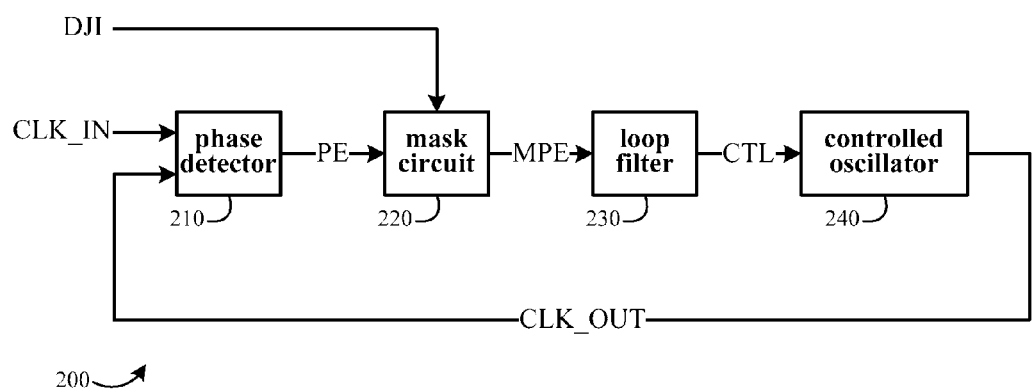
FIG. 2 shows a functional block diagram of an apparatus in accordance with an embodiment of the present invention.

A functional block diagram of an apparatus 200 for suppressing a deterministic clock jitter in accordance with an embodiment of the present invention is depicted in FIG. 2. Apparatus 200 comprises: a phase detector 210 for detecting a timing difference between an input clock CLK_IN and an output clock CLK_OUT to generate a phase error signal PE; a mask circuit 220 for masking the phase error signal PE based on a deterministic jitter indicator signal DJI to generate a masked phase error signal MPE; a loop filter 230 for filtering the masked phase error signal MPE to generate an oscillator control signal CTL; and a controlled oscillator 240 for generating the output clock CLK_OUT under a control of the oscillator control signal CTL. The input clock CLK_IN is a clock that has a pre-known deterministic jitter, where the pre-known deterministic jitter is indicated by the deterministic jitter indicator signal DJI. Apparatus 200 of FIG. 2 is the same as the prior art PLL 100 of FIG. 1 except for using the mask circuit 220 to mask the phase error signal PE.

Figure 3:
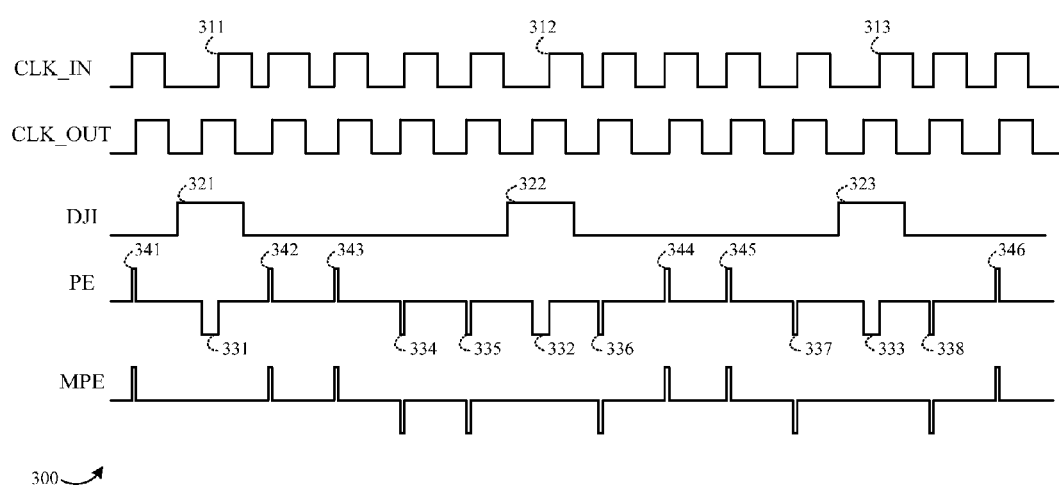
FIG. 3 shows an exemplary timing diagram for the apparatus of FIG. 2.

By way of example but not limitation, the input clock CLK_IN is a 1 GHz clock generated from a MDLL circuit that introduces a pre-known deterministic jitter that shows up once for every five clock cycles, as described earlier in this disclosure. An exemplary timing diagram 300 is shown in FIG. 3. As illustrated in the timing diagram 300, the input clock CLK_IN contains a deterministic jitter that shows up once for every five clock cycles (e.g., edges 311, 312, and 313, where a remarkable timing error occurs) due to injecting a rising edge of a 200 MHz reference clock once per five clock cycles of the input clock CLK_IN in the MPLL circuit (not shown in figure) that generates the input clock CLK_IN. The phase error signal PE represents a timing difference between the input clock CLK_IN and the output clock CLK_OUT; when a rising edge of the input clock CLK_IN arrives earlier than a rising edge of the output clock CLK_OUT, a positive pulse of the phase error signal PE is generated with a pulse width proportional to a magnitude of the timing difference (e.g., pulses 341, 342, 343, 344, 345, and 346); when a rising edge of the output clock CLK_OUT arrives earlier than a rising edge of the input clock CLK_IN, a negative pulse of the phase error signal PE is generated with a pulse width proportional to a magnitude of the timing difference (e.g., pulses 331, 332, 333, 334, 335, 336, 337, and 338). Since the origin of the deterministic jitter is pre-known in the MPLL circuit that generates the input clock CLK_IN, the location where the deterministic jitter of the input clock CLK_IN occurs is pre-known and indicated by the deterministic jitter indicator signal DJI (e.g., pulses 321, 322, and 323). In prior art PLL 100, the phase error signal is detected and used to update the oscillator control signal for every clock edge of the input clock even if the input clock contains a deterministic jitter. In apparatus 200, in contrast, the phase error signal PE is masked and disregarded if one already knows that there is a deterministic jitter associated with the clock edge of interest of the input clock. The mask circuit 220 performs the following logical operation:

$$MPE = \begin{cases} PE & \text{if } DJI = 0 \\ 0 & \text{if } DJI = 1 \end{cases} \quad (3)$$

As a result, the pulses 331, 332, and 333 of the phase error signal PE are masked when generating the masked phase error signal MPE. By doing so, the phase error (between the input clock CLK_IN and the output clock CLK_OUT) due to the deterministic jitter of the input clock CLK_IN is tossed out and thus the impact of the deterministic jitter of the input clock CLI_IN is effectively removed; therefore, the output clock CLK_OUT can have a very small deterministic jitter without using a small loop bandwidth to filter output the deterministic jitter. This allows apparatus 200 of FIG. 2 to greatly outperform the prior art PLL 100 of FIG. 1, given the same circuit design (except for using the mask circuit 220 in apparatus 200 of FIG. 2).

In an embodiment, phase detector 210 comprises a phase/frequency detector (PFD). In an embodiment, phase detector 210 comprises a charge pump circuit as an output stage to make the phase error signal PE a current-mode signal. Both PFD and charge pump are well known to those of ordinary skill in the art and thus not described in detail here (Those who that are not familiar with the concepts of PFD and charge pump are advised to refer to text books on phase lock loops). In an embodiment, loop filter 230 comprises a serial network comprising a series connection of a resistor and a capacitor; in this embodiment, the oscillator control signal is a voltage across the serial network comprising the series connection of the resistor and the capacitor. In an embodiment, the controlled oscillator 240 is a voltage controlled oscillator (VCO), which is well known to those of ordinary skill in the art and thus not described in detail here. The mask circuit 220 is a logical circuit embodying the logical operation described in (3).

Figure 4:
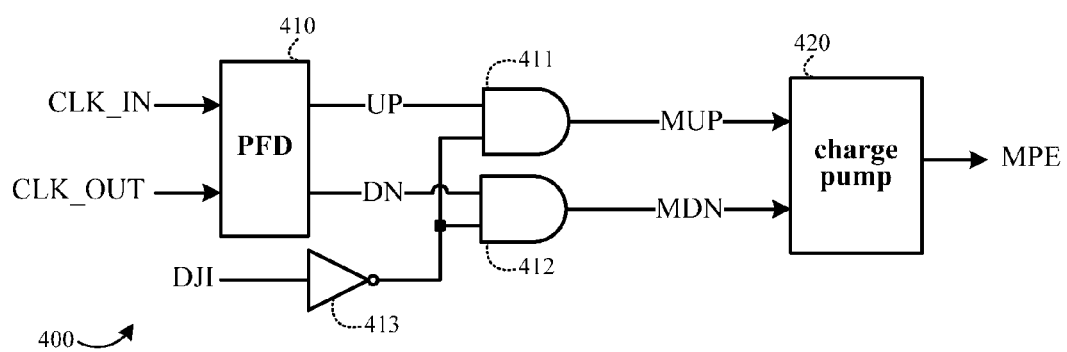
FIG. 4 shows a circuit of one implementation of a combination of the phase detector and the mask circuit of FIG. 2.

A circuit 400 suitable for embodying a combination of the phase detector 210 and the mask circuit 220 of FIG. 2 is depicted in FIG. 4. Circuit 400 comprises: a PFD (phase/frequency detector) 410 for receiving the input clock CLK_IN and the output clock CLK_OUT and outputting the phase error signal PE (implicit and thus not shown explicitly in the figure) comprising a first logical signal UP and a second logical signal DN; a first AND gate 411 and a second AND gate 412 for masking the first logical signal UP and the second logical signal DN to generate a third logical signal MUP and a fourth logical signal MDN, respectively, using the deterministic jitter indicator signal DJI; and a charge pump 420 for receiving the third logical signal MUP and the fourth logical signal MDN and generating the masked phase error signal MPE. In this embodiment, the phase error signal PE is implicit and embodied by a combination of the first logical signal UP and the second logical signal; when a rising edge of the input clock CLK_IN arrives earlier than a rising edge the output clock CLK_OUT, the first logical signal UP is asserted; when a rising edge of the output clock CLK_OUT arrives earlier than a rising edge of the input clock CLK_IN, the second logical signal DN is asserted. By using AND gates 411 and 412 and inverter 413, the first logical signal UP and the second logical signal DN are masked when the deterministic jitter indicator signal DJI is asserted, effectively masking the implicit phase error signal PE. Also, in this embodiment the masked phase error signal MPE is a current mode signal;

when the third logical signal MUP is asserted, the masked phase error signal MPE is a positive current (i.e., a current is flowing out of charge pump 420); when the fourth logical signal MDN is asserted, the masked phase error signal MPE is a negative current (i.e., a current is flowing back into charge pump 420).

It will be appreciate that other circuit embodiments or configurations may also be implemented, in place of the circuit 400, consistent with the scope and spirit of the invention.

In many applications, the input clock comes from a PLL circuit and contains a deterministic jitter that is referred to as "reference spur" because the deterministic jitter occurs coincidently with a clock edge of a reference clock. In this case, the deterministic jitter indicator signal DJI can be generated by extracting the clock edge of the reference clock; as a result, the deterministic jitter in the input clock due to the "reference spur" can be effectively alleviated. A method for extracting an edge of a clock signal is well known in prior art (e.g., by performing an exclusive-OR operation on the clock signal and a delay of the clock signal) and thus not described in detail here.

Those skilled in the art will readily observe that numerous modifications and alterations of the device and method may be made while retaining the teachings of the invention. As an example, the embodiment described in connection with FIG. 2 shows the output clock fed back as a second input clock to the phase detector 210. In an alternative embodiment, the second input clock may be derived from a different source, such that the output clock is not directly fed back to the phrase detector 210.

Accordingly, the above disclosure should be construed as limited only by the metes and bounds of the appended claims.

What is claimed is:

1. An apparatus comprising:
    a phase detector for receiving a first input clock and a second input clock and generating a phase error signal representing a timing difference between the first input clock and the second input clock, wherein the phase error signal comprises a first plurality of waveforms each having a first duration and a second plurality of waveforms each having a second duration, the second plurality of waveforms corresponding to deterministic jitter;
    a mask circuit for masking the phase error signal to generate a masked phase error signal in accordance with a deterministic jitter indicator signal that indicates a deterministic jitter of the first input clock, the masked phase error signal corresponding only to the first plurality of waveforms;
    a loop filter for filtering the masked phase error signal to generate an oscillator control signal; and
    a control oscillator for generating an output clock in accordance with a control of the oscillator control signal.

2. The apparatus of claim 1, wherein: the phase detector comprises a phase/frequency detector.

3. The apparatus of claim 1, wherein: the second input clock is the output clock.

4. The apparatus of claim 1, wherein: the masked phase error signal is the same as the phase error signal when the deterministic jitter indicator signal is not asserted.

5. The apparatus of claim 1, wherein the masked phase error signal is zero when the deterministic jitter indicator signal is asserted.

6. The apparatus of claim 1, wherein: the loop filter comprises a serial network comprising a series connection of a resistor and a capacitor.

7. The apparatus of claim 1, wherein the control oscillator is a voltage controlled oscillator.

8. The apparatus of claim 1, wherein the first input clock is originated from a phase lock loop that tracks a timing of a reference clock.

9. The apparatus of claim 1, wherein the mask circuit comprises: two AND gates, each AND gate having an input coupled to the deterministic jitter indicator signal.

10. The apparatus of claim 6, wherein the oscillator control signal is a voltage across the serial network.

11. The apparatus of claim 8, wherein the deterministic jitter indicator signal is generated by extracting a clock edge of the reference clock.

12. The apparatus of claim 9, wherein the mask circuit further comprises a charge pump that receives an output of each of the two AND gates, the charge pump generating the masked phase error signal.

13. A method for generating an output clock comprising:
    detecting a timing difference between a first input clock and a second input clock to generate a phase error signal, wherein the phase error signal comprises a first plurality of waveforms each having a first duration and a second plurality of waveforms each having a second duration, the second plurality of waveforms corresponding to deterministic jitter;
    generating a masked phase error signal by masking the phase error signal based on a deterministic jitter indicator signal, the masked phase error signal corresponding only to the first plurality of waveforms;
    generating an oscillator control signal by filtering the masked phase error signal; and
    generating an output clock in accordance with the oscillator control signal.

14. The method of claim 13, wherein the second input clock is the output clock.

15. The method of claim 13, wherein: representing the timing difference comprises using a charge pump circuit to make the phase error signal a current-mode signal.

16. The method of claim 13, wherein: masking the phase error signal comprising performing a logical operation so that the masked phase error signal is the same as the phase error signal when the deterministic jitter indicator signal is not asserted.

17. The method of claim 13, wherein: masking the phase error signal comprising performing a logical operation so that the masked phase error signal and the phase error signal are different when the deterministic jitter indicator signal is asserted.

18. The method of claim 13, wherein the masked phase error signal is zero when the deterministic jitter indicator signal is asserted.

19. The method of claim 13, wherein the first input clock originates from a phase lock loop that tracks a timing of a reference clock.

20. The method of claim 19, wherein the deterministic jitter indicator signal is generated by extracting a clock edge of the reference clock.

* * * * *